United States Patent [19]
Park

[11] Patent Number: 5,858,842
[45] Date of Patent: Jan. 12, 1999

[54] METHODS OF FORMING COMBINED TRENCH AND LOCOS-BASED ELECTRICAL ISOLATION REGIONS IN SEMICONDUCTOR SUBSTRATES

[75] Inventor: Tai-su Park, Kyungki-do, Rep. of Korea

[73] Assignee: Samsung Electronics Co., Ltd., Suwon, Rep. of Korea

[21] Appl. No.: 675,534

[22] Filed: Jul. 3, 1996

[51] Int. Cl.$^6$ .................................................. H01L 21/76
[52] U.S. Cl. .......................... 438/297; 438/425; 438/426; 438/296
[58] Field of Search ................... 438/424–426, 438/297, 296

[56] References Cited

U.S. PATENT DOCUMENTS

| | | | |
|---|---|---|---|
| 5,292,689 | 3/1994 | Cronin et al. | 437/228 |
| 5,346,584 | 9/1994 | Nasr et al. | 156/636 |
| 5,360,753 | 11/1994 | Park et al. | 437/67 |
| 5,385,861 | 1/1995 | Bashir et al. | 437/67 |
| 5,453,639 | 9/1995 | Cronin et al. | 257/510 |
| 5,466,628 | 11/1995 | Lee et al. | 437/60 |
| 5,492,858 | 2/1996 | Bose et al. | 437/67 |
| 5,494,857 | 2/1996 | Cooperman et al. | 437/228 |
| 5,510,652 | 4/1996 | Burke et al. | 257/752 |
| 5,728,620 | 3/1998 | Park | 438/426 |

OTHER PUBLICATIONS

B. Davari et al., *A New Planarization Technique, Using A Combination Of RIE And Chemical Mechanical Polish (CMP)*, IEDM 89, pp. 61–64.

*Primary Examiner*—Charles Bowers
*Assistant Examiner*—David S Blum
*Attorney, Agent, or Firm*—Myers Bigel Sibley & Sajovec

[57] ABSTRACT

Methods of forming electrical isolation regions in semiconductor substrates include the steps of forming a first electrical isolation region at a face of a semiconductor substrate, then forming a trench in the semiconductor substrate, laterally adjacent the first electrical isolation region, and then forming a trench isolation region in the trench so that the trench isolation region is contiguous with the first isolation region. In particular, these methods include the steps of forming a pad insulating layer on the face of a semiconductor substrate and then forming a first nitride layer on the pad insulating layer. The first nitride layer is then patterned by removing a portion thereof to define an opening extending opposite an inactive region within the semiconductor substrate. A second nitride layer is then formed on the patterned first nitride layer and in the opening. The second nitride layer is then patterned within the opening by removing a portion thereof extending opposite a portion of the inactive region. The second nitride layer is then used as a mask to selectively form a first isolation region by thermally oxidizing the substrate. The second nitride layer is then removed and followed by the step of etching a laterally adjacent portion of the inactive region to form a trench. The trench is then filled by depositing an oxide layer in the trench and on the first isolation region. Chemical-mechanical polishing is then performed to planarize the deposited oxide layer and the first isolation region and form a single composite isolation region therefrom. Stable isolation characteristics can therefore be obtained because the above sequence of steps reduces the degree of dishing associated with the composite isolation region, even when relatively wide trenches are used for isolation.

12 Claims, 4 Drawing Sheets ary of the invention, methods of forming a combined LOCOS and STI structure...

METHODS OF FORMING COMBINED TRENCH AND LOCOS-BASED ELECTRICAL ISOLATION REGIONS IN SEMICONDUCTOR SUBSTRATES

FIELD OF THE INVENTION

The present invention relates to semiconductor devices and fabrication methods, and more particularly to methods of forming semiconductor devices with electrical isolation regions therein.

BACKGROUND OF THE INVENTION

Device isolation techniques play an important role in the design and performance of highly integrated semiconductor circuits by electrically isolating regions and devices therein from adjacent devices and regions. Such integrated semiconductor circuits included memory devices having arrays of memory cells and peripheral devices for driving the memory cells, for example. Moreover, as the degree of integration in semiconductor circuits increases, there is a concomitant need to develop techniques for forming isolation regions which can be scaled to provide isolation regions having smaller dimensions, but without sacrificing the isolation capability of the regions.

Attempts to improve the isolation capability of field oxide regions in a semiconductor substrate by making these regions narrower to facilitate higher levels of lateral integration, while at the same time thicker to compensate for the decrease in isolation capability caused by the reduction in separation distance between adjacent devices, pose significant drawbacks. In particular, the formation of isolation regions of increased thickness typically causes an increase in the nonuniformity of subsequently formed regions and layers (e.g., metal wiring) which cover both the active regions and inactive isolation regions. Unfortunately, such nonuniformities, which may be characterized by a vertical "step-height" between the face of the semiconductor substrate where an active region(s) is formed and the top surface of the isolation regions, typically cause a reduction in yield as higher and higher levels of integration are attempted.

One typical method for forming electrical isolation regions in semiconductor substrates is referred to as a local oxidation of silicon (LOCOS) method. For example, referring to FIGS. 1–2, a method of forming an electrical isolation region 13 in a semiconductor substrate 1 using LOCOS, is illustrated. In particular, FIG. 1 illustrates a structure resulting from the steps of forming, in sequence, a pad oxide film 3 and a silicon nitride film 5 on a silicon substrate 1. The silicon nitride film 5 is then patterned by selectively etching the film to define openings 9 therein, which extend opposite those portions of the substrate wherein inactive/isolation regions are to be formed. The remaining portions 11 of the silicon nitride film 5 are also defined during the etching step, opposite those portions of the substrate wherein active/device regions are to be formed. Referring still to FIG. 1, preliminary channel-stop impurity regions 7 are then formed in the inactive portions of the substrate by implanting dopants into the substrate, using the patterned silicon nitride film 5 as a mask.

Referring now to FIG. 2, a thermal oxidation step is performed to form field oxide isolation regions 13, using the patterned silicon nitride film 5 as an oxidation mask. During this oxidation step, diffusion of the implanted dopants also takes place to form channel-stop impurity regions 15. As will be understood by those skilled in the art, during the thermal oxidation step, bird's beak shaped oxide extensions will form underneath the patterned silicon nitride film 5, as illustrated. The formation of bird's beak extensions causes the effective width of the field oxide isolation regions to increase, as represented by numerals 17 and 20. Here, reference numeral 19 illustrates the increase in width on each side of the field oxide isolation region 13 which is attributable to the bird's beak shaped extensions. Finally, reference numeral 23 represents the actual size of an active region, which is reduced by the bird's beak shaped extensions. Accordingly, the LOCOS method may not be suitable for applications requiring high degrees of integration, because the lateral width of the bird's beak extensions is not readily scalable. This is particularly true when thicker isolation regions are used to increase isolation capability, because thicker isolation regions typically cause an increase in the lateral dimension of the bird's beak extensions.

FIGS. 3–6 also illustrate a conventional method of forming shallow trench isolation (STI) regions in a semiconductor substrate 21. In particular, as illustrated by FIG. 3, a pad oxide film 22 having a thickness of about 240 Å is formed on the substrate 21 by thermal oxidation. Then, a silicon nitride film 24, having a thickness of about 1500 Å, is formed on the pad oxide film 22 by a low pressure chemical vapor deposition method (LPCVD). An oxide mask 26 is then formed by depositing an oxide film having a thickness of about 1000 Å and then patterning the oxide film using conventional etching techniques. Referring to FIG. 4, trenches are then formed in the substrate 21 by reactive ion etching (RIE) the silicon nitride film 24 and the pad oxide film 22, using the oxide mask 26, and then dry-etching the substrate 21, as will be understood by those skilled in the art. The trenches may be made of varying width, depending on the application and degree of isolation required. The exposed silicon on the sidewalls and bottom of the trenches is then thermally oxidized to form an oxide film 27. Referring still to FIG. 4, a polycrystalline silicon film having a thickness of approximately 5000 Å or thicker is then deposited into the trenches and anisotropically etched to form a polycrystalline silicon film 28. As illustrated, the relatively narrow trench is typically completely filled by the polycrystalline silicon film 28, however the film 28 in the wider trench may be concave in shape and thereby have a centrally depressed region at the middle of the trench. Accordingly, the profile of the silicon film 28 may vary depending on the width, depth and shape of the trench.

Referring now to FIG. 5, the polycrystalline silicon film 28 is then thermally oxidized to form a field oxide film 29, however, the concave profile of the polycrystalline silicon film 28 is typically replicated in the profile of the field oxide film 29. Then, as illustrated by FIG. 6, the oxide mask 26, the silicon nitride film 24 and the pad oxide film 22 are removed, preferably by a wet-etch technique using a buffered oxide etchant (BOE) and a phosphoric acid solution. A sacrificial oxide film (not shown) is then grown and etched to form the resulting trench isolation structure. Unfortunately, the central depression G in the field oxide film 29 increases the roughness of upper level surfaces and may reduce the yield of integrated circuits formed in the substrate by, among other things, causing shorts between metal lines such as gate and bit lines of an integrated memory device. In addition, as illustrated by reference R, bird's beak shaped extensions may also be present which, as described above with respect to FIGS. 1–2, can cause an increase in the effective lateral width of the trench isolation regions. Furthermore, the step of removing the oxide mask 26 typically results in a removal of a portion of the field oxide film 29 as well. Accordingly, the thickness of the field oxide film 29 may have to be made greater to account for the partial removal during the step of removing the oxide mask 26. Yet, by increasing the thickness of the field oxide film 29, the lateral width of the bird's beak extensions also increases and thereby further inhibits attempts to increase integration densities. This and other deficiencies of LOCOS and STI isolation techniques are more fully described in U.S. Pat. Nos. 5,385,861 to Bashir et al., 5,492,858 to Bose et al. and 5,494,857 to Cooperman et al.

In order to improve upon the above-mentioned trench isolation method, chemical-mechanical polishing techniques (CMP) have been proposed. Such polishing techniques typically include the step of polishing the surface of the substrate to remove excess field insulation, after the trenches have been formed and filled with an appropriate insulation material. However, a dishing phenomenon, known to those skilled in the art, may occur when trench isolation regions of substantial width are formed. This phenomenon, which is described in the aforementioned U.S. Pat. No. 5,494,857 to Cooperman et al., typically causes poor local planarization and can therefore reduce yield. Attempts to reduce the occurrence of the dishing phenomenon are described in an article by B. Davari et al., entitled *A New Planarization Technique, Using a Combination of RIE and Chemical Mechanical Polish (CMP)*, IEDM Technical Digest, pp. 61–64 (1989) and the aforementioned U.S. Pat. No. 5,494,857 to Cooperman et al. In this article, a combination of RIE and CMP steps are performed to improve planarization. In particular, an initial planarization step using RIE is performed prior to a final planarization step using CMP, in order to reduce the degree of dishing present in the resulting structure, as described with respect to FIG. 5 of the aforementioned Davari article. Unfortunately, in addition to requiring a separate RIE step, this method may require additional steps such as a step of forming block resist patterns over relatively wide isolation regions, in order to improve the degree of planarization that can be achieved.

Thus, notwithstanding the above described methods, there continues to be a need for relatively simple methods of forming isolation regions having uniformly planar surfaces, which can be scaled to allow for high levels of integration.

SUMMARY OF THE INVENTION

It is therefore an object of the present invention to provide improved methods of forming electrical isolation regions in a semiconductor substrate, and isolation regions formed thereby.

It is another object of the present invention to provide improved methods of forming electrical isolation regions having uniformly planar surfaces, and isolation regions formed thereby.

It is still another object of the present invention to provide methods of forming electrical isolation regions which are compatible with chemical-mechanical planarization (CMP) techniques, and isolation regions formed thereby.

These and other objects, features and advantages of the present invention are provided by methods of forming electrical isolation regions between active device regions within a semiconductor substrate, and isolation regions formed thereby. These methods include the steps of forming a first electrical isolation region at a face of a semiconductor substrate using LOCOS, then forming a trench in the semiconductor substrate, adjacent the first electrical isolation region, and then forming a trench isolation region in the trench so that the trench isolation region is contiguous with the first isolation region.

In particular, these methods include the steps of forming a pad insulating layer on the face of a semiconductor substrate and then forming a first nitride layer on the pad insulating layer. The first nitride layer is then patterned by removing a portion thereof to define an opening extending opposite an inactive region within the semiconductor substrate. A second nitride layer is then formed on the patterned first nitride layer and in the opening. The second nitride layer is then patterned within the opening by removing a portion thereof extending opposite a portion of the inactive region. LOCOS is then performed by thermally oxidizing the substrate, using the second nitride layer as a mask, to selectively form a first isolation region. The second nitride layer is then removed and followed by the step of etching a laterally adjacent portion of the inactive region to form a trench. Preferably, the trench is formed using the first isolation region as a mask. The trench is then filled by depositing an oxide layer in the trench and on the first isolation region. Chemical-mechanical polishing is then performed to planarize the deposited oxide layer and the first isolation region and form a single composite isolation region therefrom. In particular, the combination of a deposited "soft" oxide in the trench and a laterally adjacent thermally grown "hard" oxide provides a composite isolation region having "soft" and "hard" polishing portions therein which polish at respective relative rates. Here, a hard polishing portion polishes more slowly than a soft polishing portion, under similar polishing conditions. Stable isolation characteristics can therefore be obtained because the above sequence of steps reduces the degree of dishing associated with the composite isolation region, even when relatively wide trenches are used for isolation.

DESCRIPTION OF PREFERRED EMBODIMENTS

Figure 1:
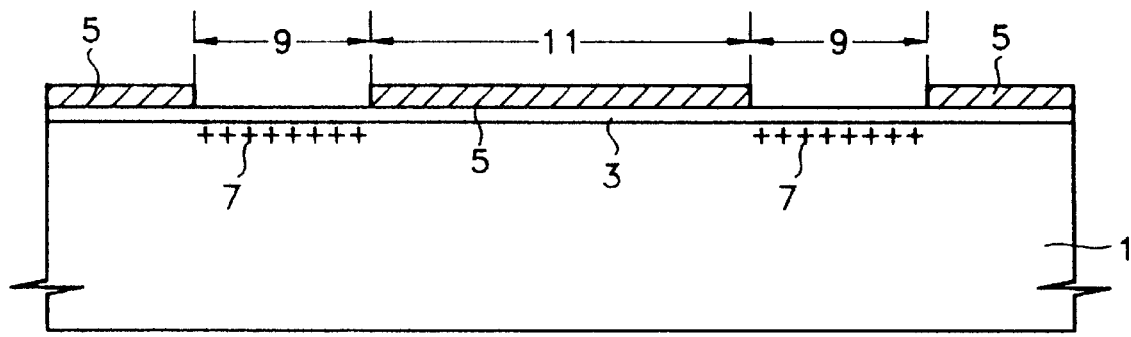
FIGS. 1–2 illustrate schematic cross-sectional views of intermediate structures illustrating one method of forming an electrical isolation region in a semiconductor substrate, according to the prior art.
Figure 2:
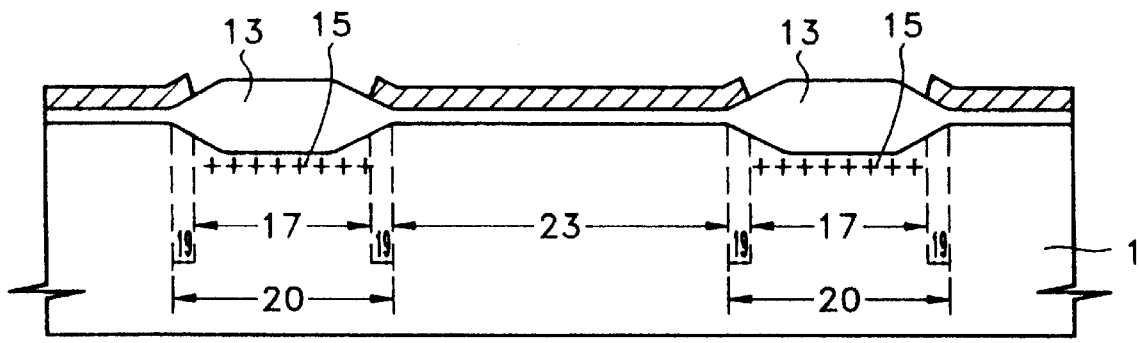
Figure 3:
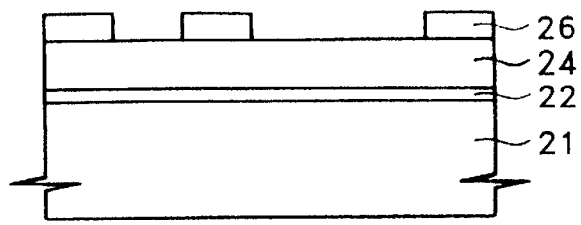
FIGS. 3–6 illustrate schematic cross-sectional views of intermediate structures illustrating another method of forming an electrical isolation region in a semiconductor substrate, according to the prior art.
Figure 4:
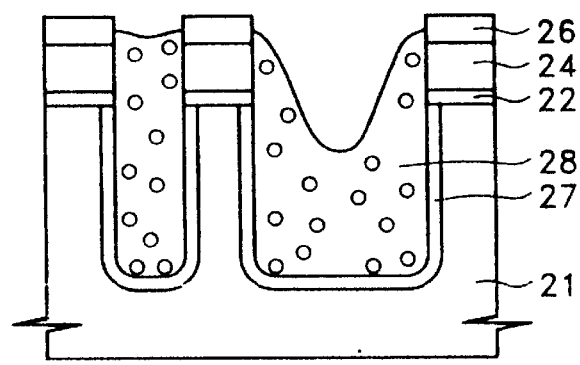
Figure 5:
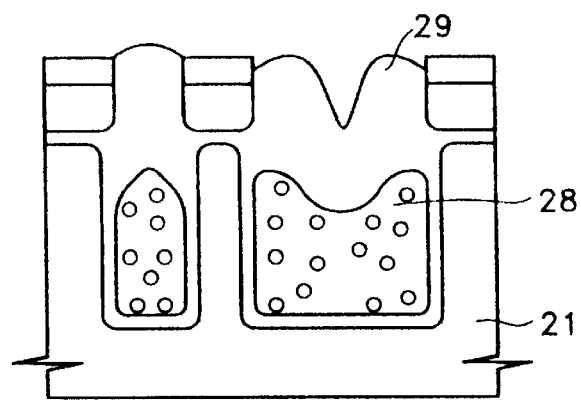
Figure 6:
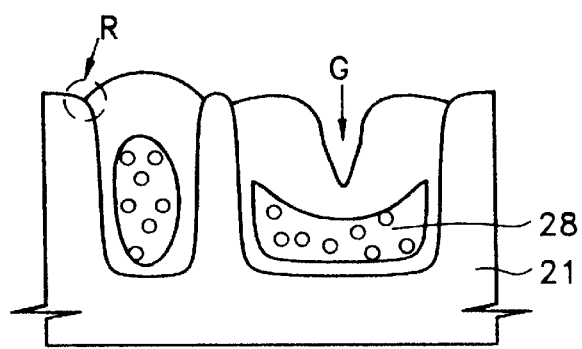

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 7:
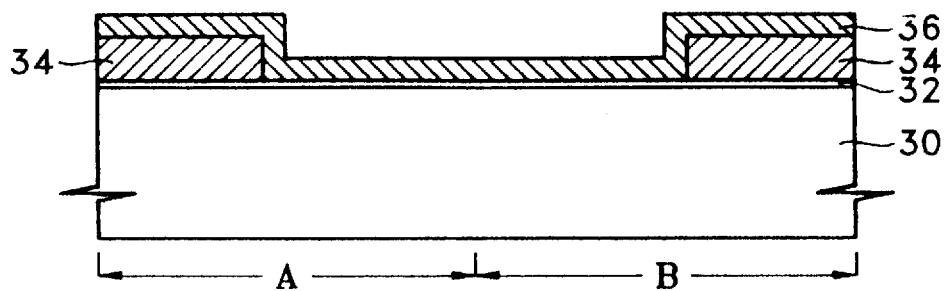
FIGS. 7–13 illustrate schematic cross-sectional views of intermediate structures illustrating a method of forming an electrical isolation region in a semiconductor substrate, according to one embodiment of the present invention.

Referring now to FIGS. 7–13, a preferred method of forming an electrical isolation region in a semiconductor substrate, according to a first embodiment of the present invention, will be described. In particular, FIG. 7 illustrates a semiconductor substrate 30 (e.g., silicon) in which active semiconductor devices such as field effect transistors and bipolar junction transistors, for example, can be formed. In the case of an integrated circuit memory device containing an array of memory cells and circuits for driving and controlling the array of memory cells, the substrate may be partitioned into a memory cell array portion (shown as "A") and a peripheral or driving circuit portion (shown as "B"), for example. Accordingly, in order to electrically isolate active devices in the memory cell array portion "A" from active devices in the peripheral circuit portion "B", an electrical isolation region can be formed at the boundary therebetween. However, the present invention is not limited to a method of forming electrical isolation regions between memory cell array portions and peripheral circuit portions of an integrated memory device, but is applicable to a wide range of device and integrated circuits where electrical isolation between adjacent active regions of a substrate is utilized.

Referring again to FIG. 7, the method of the first embodiment includes the steps of forming a pad insulating layer 32 on a face of the semiconductor substrate 30. The pad insulating layer 32 may comprise a thermally grown layer of silicon dioxide having a thickness in a range between about 80 and 240 Å. A first nitride layer 34 is then formed on the pad insulating layer 32. The first nitride layer 34 may be formed by such techniques as low pressure chemical vapor deposition (LPCVD) of silicon nitride ($Si_3N_4$) to a thickness in a range between about 1500 to 2500 Å. As illustrated, the first nitride layer 34 is then patterned to expose the pad insulating layer 32 and define a non-active region in the substrate, at the boundary of the memory cell array portion "A" and peripheral circuit portion "B". As will be understood by those skilled in the art, the first nitride layer 34 may be patterned using conventional etching techniques and a mask (not shown). After the first nitride layer 34 is patterned, a second nitride layer 36 preferably having a thickness in a range between about 100 and 700 Å is formed on the patterned first nitride layer 34 and the exposed pad insulating layer 32. The second nitride layer 36 may also be formed by such conventional techniques as LPCVD.

Figure 8:
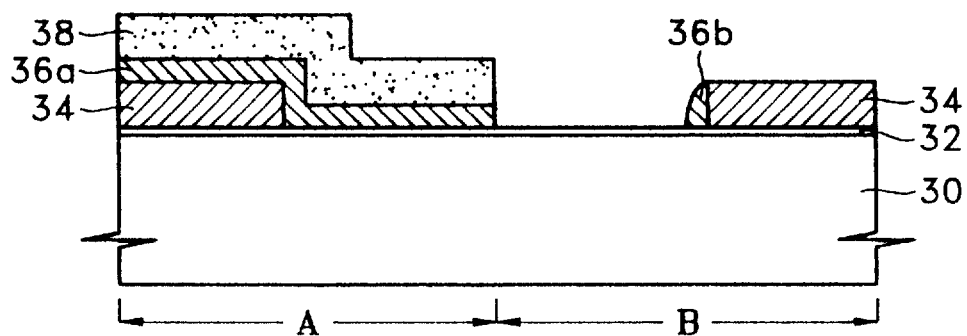
Figure 9:
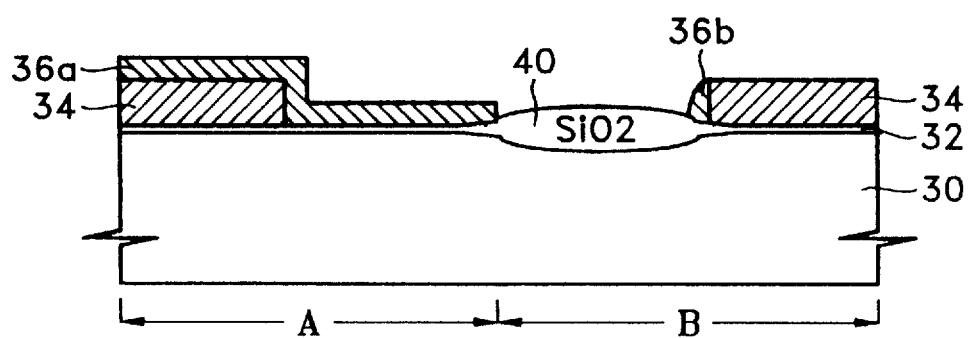

Referring now to FIG. 8, the second nitride layer 36 is then patterned to form an opening therein which exposes the pad insulating layer 32 and defines an underlying first portion of the face of the semiconductor substrate 30, in the peripheral circuit portion "B". As illustrated, the second nitride layer 36 may be patterned by depositing and photolithographically defining a photoresist layer 38 and then using the photoresist layer as a mask to etch the second nitride layer 36 using reactive ion etching (RIE) techniques, for example. As will be understood by those skilled in the art, etching the second nitride layer 36 using RIE may leave a residual nitride spacer 36b on a sidewall of the patterned first nitride layer 34, as illustrated. The patterned photoresist layer 38 is then removed. Referring now to FIG. 9, a first isolation region 40 is preferably formed in an inactive region within the peripheral circuit portion "B", as shown, by selectively oxidizing the semiconductor substrate 30 at the face, using the patterned second nitride layer 36a as an oxidation mask. Here, conventional techniques such as local oxidation of silicon (LOCOS) may be used to form a first isolation region having a thickness in a range between about 3000 and 5000 Å. As will be understood by those skilled in the art, lateral undercutting of the patterned second nitride layer 36a may take place during the oxidation step and cause the formation of bird's beak extensions at the edges of the first isolation region 40, as shown. To inhibit the formation of bird's beaks, the second nitride layer 36a is most preferably formed to a thickness of only about 100 Å. In order to reduce the vertical distance between the face of the substrate 30 and the top surface of the first isolation region 40, the exposed portion of the pad insulating layer 32 and the underlying face of the semiconductor substrate 30 are preferably etched, using the patterned second nitride layer 36a as a etching mask, prior to formation of the first isolation region 40. For example, by selectively etching the pad insulating layer 32 and the underlying portion of the substrate, the height of the first isolation region 40 can be reduced, relative to the face of the substrate 30. This provides a more planar surface after completion of the first isolation region forming step.

Figure 10:
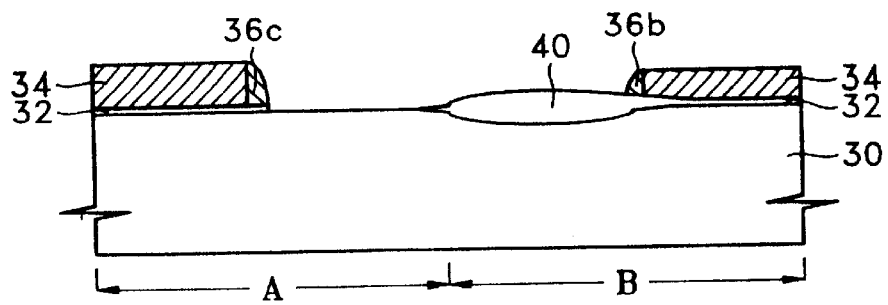

As illustrated best by FIG. 10, the patterned second nitride layer 36a and pad insulating layer 32 can then be removed from the face of the substrate 30 in the region defined by the patterned first nitride layer 34. In particular, the second nitride layer 36a may be removed using reactive ion etching, which may leave a residual nitride spacer 36c, and then the exposed portion of the pad insulating layer 32 may be removed by reactive ion or wet etching with a buffered oxide etchant (BOE) or a diluted HF solution.

Figure 11:
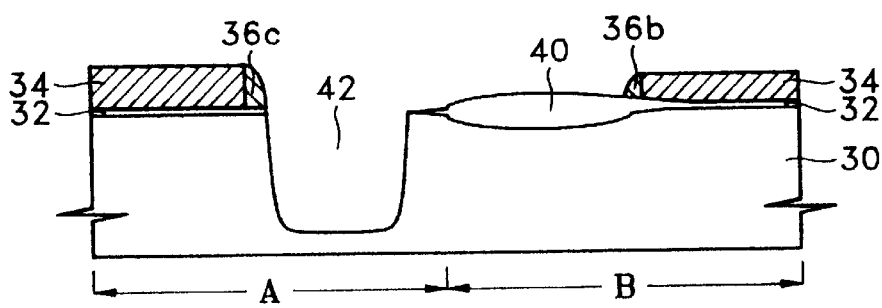
Figure 12:
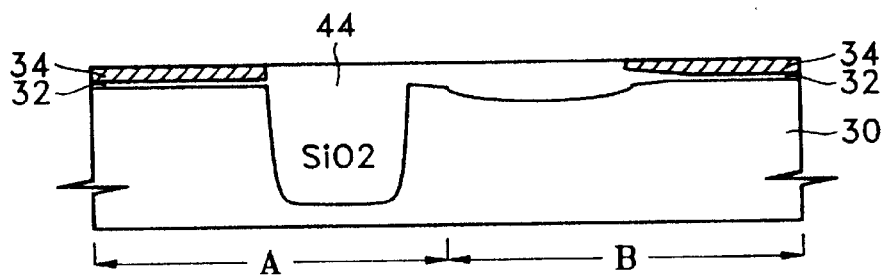

Referring now to FIG. 11, a trench 42 is then preferably formed laterally adjacent the first isolation region 40, and most preferably at an edge thereof, using conventional etching techniques. Here, the residual nitride spacer 36c and the first isolation region 40 are preferably used as a mask during etching of the trench. In particular, as illustrated, the trench 42 may be formed in an inactive region within the memory cell array portion "A" of the substrate 30. The trench 42 may be formed to have a relatively narrow width on the order of approximately 0.3 μm, however, the trench 42 may be wider to provide a greater degree of electrical isolation between adjacent active regions within the substrate 30. Preferably, the width of the trench 42 is defined to be narrower than the width of the first isolation region 40. Then, as shown by FIG. 12, the trench 42 is filled by preferably depositing a layer of silicon dioxide into the trench 42 and onto the first isolation region 40 and patterned first nitride layer 34, using such techniques as LPCVD or plasma enhanced chemical vapor deposition (PECVD). In contrast to prior art methods of forming trench isolation regions, the thickness of the deposited layer of silicon dioxide is preferably kept at a low value on the order of about 2500 Å or less and typically only about 2000 Å, instead of greater than about 5000 Å which is typical with prior art methods.

Referring still to FIG. 12, chemical-mechanical polishing (CMP) of the deposited layer of silicon dioxide is then preferably performed until the patterned first nitride layer 34 is exposed. This defines a trench isolation region 44. Alternatively, the deposited layer of silicon dioxide may be etched using reactive ion etching (RIE) or a combination of RIE and then CMP to expose the patterned first nitride layer 34. During this step, a top surface of the first isolation region 40 will also be polished once the deposited layer of silicon dioxide thereon is removed. For example, the polishing of the first isolation region 40 can cause its thickness to be reduced to about 1200 Å.

Figure 13:
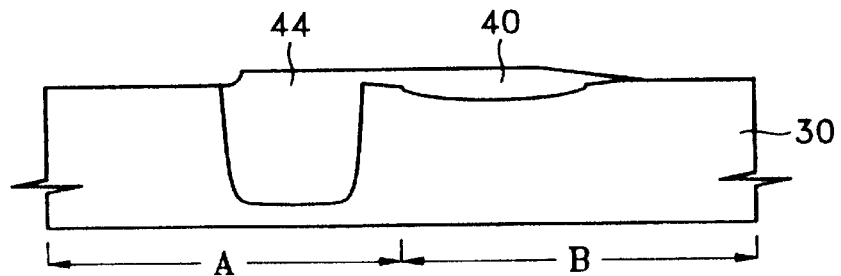

The dishing phenomenon is also made less noticeable because by using the above described steps, the top surface of the deposited layer of silicon dioxide will typically be generally planar and any imperfections or fluctuations in thickness therein will typically be kept small to provide low step heights. This is true even if the trench 42 is formed to have width of several millimeters. Moreover, if the density of the deposited layer of silicon dioxide is maintained at a level below the density of the first isolation region 40, which is typical if the first isolation region 40 is formed by thermal oxidation and the trench isolation region 44 is formed by LPCVD or PECVD, the dishing phenomenon can be further reduced because the polishing rate of the first isolation region 40 will be slower than the polishing rate of the deposited layer of silicon dioxide (and the trench isolation region 44). Finally, the exposed portions of the patterned first nitride layer 34 and underlying portion of the pad insulating layer 32 are removed using such techniques as wet etching, as illustrated by FIG. 13.

By using the above described method, stable isolation characteristics can be obtained because the resulting isolation region, which comprises both the trench isolation region 44 and the first isolation region 40, has more uniform surface. In particular, the sequence of forming the first isolation region and then the trench isolation region and then polishing using CMP, reduces the degree of dishing associated with the resulting isolation region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an isolation region, comprising the steps of:

forming a pad insulating layer on a face of a semiconductor substrate;

forming a first nitride layer on the pad insulating layer, opposite the face of the semiconductor substrate;

patterning the first nitride layer to define a first opening therein which extends opposite a first portion of the face;

forming a second nitride layer on the patterned first nitride layer and in the first opening;

patterning the second nitride layer to define a second opening therein which extends opposite a second portion of the face;

forming a first isolation region in the semiconductor substrate by selectively oxidizing the second portion of the face, using the patterned second nitride layer as an oxidation mask;

forming a trench in the semiconductor substrate by etching the face, using the patterned first nitride layer and first isolation region as an etching mask; and forming a second isolation region in the trench and on the first isolation region.

2. The method of claim 1, wherein said second nitride layer patterning step comprises patterning the second nitride layer to expose a portion of the pad insulating layer extending opposite the second portion of the face of the semiconductor substrate; and wherein said second nitride layer patterning step is followed by the step of etching the pad insulating layer to expose the second portion of the face of the semiconductor substrate, using the patterned second nitride layer as an etching mask.

3. The method of claim 1, wherein said pad insulating layer forming step comprises forming a silicon dioxide layer having a thickness in a range between about 80 and 240 Å; wherein said first nitride layer forming step comprises forming a silicon nitride layer having a thickness in a range between about 1500 and 2500 Å; and wherein said second nitride layer forming step comprises forming a silicon nitride layer having a thickness in a range between about 100 and 700 Å.

4. The method of claim 1, wherein said step of selectively oxidizing the second portion of the face of the semiconductor substrate is followed by the step of removing the patterned second nitride layer prior to said step of forming a trench.

5. A method of forming an electrical isolation region, comprising the steps of:

forming a first masking layer having a first opening therein, on a face of a semiconductor substrate; then forming a second masking layer having a second opening therein, in the first opening in the first masking layer; then oxidizing the semiconductor substrate at a location extending opposite the second opening to define a first electrical isolation region, using the second masking layer as an oxidation mask; then removing the second masking layer;

etching the semiconductor substrate at a location extending opposite the first opening to define a trench therein, using the first electrical isolation region as an etching mask; and forming a second electrical isolation region in the trench and on the first electrical isolation region.

6. The method of claim 5, wherein said step of forming a first masking layer comprises the step of forming a first nitride layer having a thickness in a range between about 1500 and 2500 Å, on the face of the semiconductor substrate; and wherein said step of forming a second masking layer comprises the step of forming a second nitride layer having a thickness in a range between about 100 and 700 Å, in the first opening in the first masking layer.

7. The method of claim 6, wherein said step of forming a first masking layer is preceded by the step of forming a silicon dioxide layer having a thickness in a range between about 80 and 240Å, on the face of the semiconductor substrate.

8. The method of claim 7, wherein said step of oxidizing the semiconductor substrate at a location extending opposite the second opening is preceded by the step of etching the semiconductor substrate at the location extending opposite the second opening.

9. The method of claim 5, wherein said step of oxidizing the semiconductor substrate at a location extending opposite the second opening is preceded by the step of etching the semiconductor substrate at the location extending opposite the second opening.

10. The method of claim 5, wherein said step of forming a second electrical isolation region comprises the step of forming a second electrical isolation region in the trench, on the first electrical isolation region and on the first masking layer.

11. The method of claim 10, further comprising the step of planarizing the second electrical isolation region to expose the first masking layer.

12. The method of claim 1, wherein said step of forming a first isolation region in the semiconductor substrate is preceded by the step of etching the pad insulating layer and the semiconductor substrate, using the patterned second nitride layer as an etching mask.

* * * * *